United States Patent
Gao

(10) Patent No.: US 12,315,546 B2
(45) Date of Patent: May 27, 2025

(54) SIGNAL CONTROL CIRCUIT, SIGNAL CONTROL METHOD FOR BLOCKING ACTIVATION OPERATIONS AND SEMICONDUCTOR MEMORY

(71) Applicant: CHANGXIN MEMORY TECHNOLOGIES, INC., Hefei (CN)

(72) Inventor: Enpeng Gao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 195 days.

(21) Appl. No.: 18/167,819

(22) Filed: Feb. 10, 2023

(65) Prior Publication Data
US 2023/0352074 A1    Nov. 2, 2023

Related U.S. Application Data

(63) Continuation of application No. PCT/CN2022/098681, filed on Jun. 14, 2022.

(30) Foreign Application Priority Data

Apr. 29, 2022    (CN) .......................... 202210475197.9

(51) Int. Cl.
   *G11C 11/406*    (2006.01)
   *G11C 11/4093*   (2006.01)

(52) U.S. Cl.
   CPC .... *G11C 11/40607* (2013.01); *G11C 11/4093* (2013.01)

(58) Field of Classification Search
   CPC .......... G11C 11/40607; G11C 11/4093; G11C 11/4078; G11C 11/4076; G11C 11/408; G11C 11/4063
   See application file for complete search history.

(56) References Cited

U.S. PATENT DOCUMENTS

| | | | |
|---|---|---|---|
| 2002/0180412 A1 | 12/2002 | Yi | |
| 2013/0126716 A1 | 5/2013 | Lee | |
| 2017/0186476 A1* | 6/2017 | Jung | .................... G11C 11/4085 |
| 2020/0211635 A1 | 7/2020 | Johnson et al. | |
| 2021/0374006 A1 | 12/2021 | Wang et al. | |
| 2023/0154522 A1* | 5/2023 | Kim | .................. G11C 11/40603 |
| | | | 365/222 |
| 2023/0178140 A1* | 6/2023 | Cho | .................... G11C 11/4096 |
| | | | 365/222 |
| 2024/0185910 A1* | 6/2024 | Devaux | .................. G11C 29/52 |

FOREIGN PATENT DOCUMENTS

| | | |
|---|---|---|
| CN | 1463492 A | 12/2003 |
| CN | 103544108 A | 1/2014 |
| CN | 112420107 A | 2/2021 |
| CN | 113168863 A | 7/2021 |
| CN | 113342615 A | 9/2021 |

* cited by examiner

*Primary Examiner* — Jerome Leboeuf
(74) *Attorney, Agent, or Firm* — Syncoda LLC; Feng Ma

(57) ABSTRACT

A signal control circuit includes: a generating circuit configured to accumulate execution times of an activation operation and output a block signal in response to an accumulated value being greater than or equal to a first preset value; and a logic circuit configured to receive an activation operation signal and the block signal, block outputting of the activation operation signal in response to receiving the block signal, and output the activation operation signal in response to not receiving the block signal.

16 Claims, 13 Drawing Sheets

SIGNAL CONTROL CIRCUIT, SIGNAL CONTROL METHOD FOR BLOCKING ACTIVATION OPERATIONS AND SEMICONDUCTOR MEMORY

CROSS-REFERENCE TO RELATED APPLICATIONS

This is a continuation of International Application No. PCT/CN2022/098681 filed on Jun. 14, 2022, which claims priority to Chinese Patent Application No. 202210475197.9 filed on Apr. 29, 2022. The disclosures of the above-referenced applications are hereby incorporated by reference in their entirety.

BACKGROUND

The Dynamic Random Access Memory (DRAM) is a semiconductor memory device commonly used in computers. The DRAM includes many repetitive memory cells, and different memory cells need to be selected through word lines and bit lines. That is to say, there are a large number of word lines in the DRAM, and these word lines are arranged adjacent to each other. When a certain word line is subjected to the Row Hammer effect, one or more memory cells on a word line adjacent to the certain word line may generate data errors. At present, the problem caused by the row hammer effect is generally solved by performing a supplementary refresh operation on the basis of periodic refresh. However, the above mechanism cannot completely avoid the impact of the row hammer effect, and data errors may still occur due to a Row Hammer attack.

SUMMARY

The present disclosure relates to, but is not limited to, a signal control circuit, a signal control method, and a semiconductor memory.

The technical solutions of the disclosure are implemented as follows.

In a first aspect, embodiments of the present disclosure provide a signal control circuit including: a generating circuit, configured to accumulate execution times of an activation operation, and output a block signal in response to an accumulated value being greater than or equal to a first preset value; and a logic circuit, configured to receive an activation operation signal and the block signal, block outputting of the activation operation signal in response to receiving the block signal, and output the activation operation signal in response to not receiving the block signal.

In a second aspect, embodiments of the present disclosure provide a signal control method including: receiving an activation operation signal; and accumulating execution times of an activation operation to an accumulated value; blocking outputting of the activation operation signal in response to the accumulated value being greater than or equal to a first preset value; and outputting the activation operation signal in response to the accumulated value being smaller than the first preset value.

DETAILED DESCRIPTION

Figure 1:
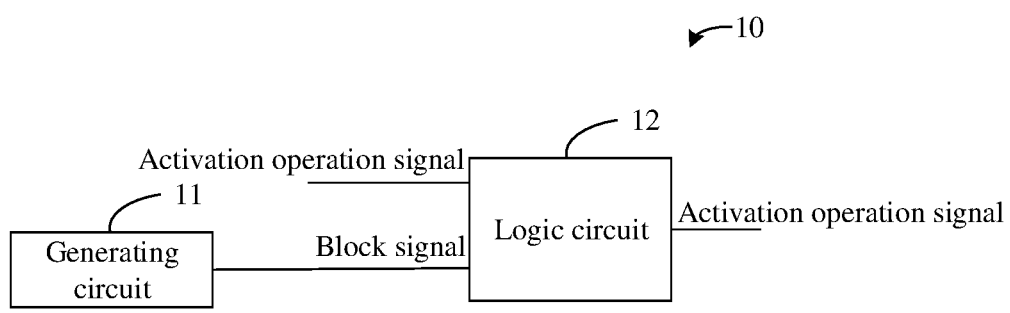
FIG. 1 illustrates a schematic structural diagram of a signal control circuit according to an embodiment of the present disclosure.

The technical scheme in the embodiment of the present disclosure will be clearly and completely described below in conjunction with the drawings in the embodiment of the present disclosure. It can be appreciated that the specific embodiments described herein are intended only to explain the relevant disclosure and not to limit the disclosure. In addition it should be noted that for convenience of description, only portions related to the relevant disclosure are shown in the drawings.

Unless otherwise defined, all technical and scientific terms used herein have the same meaning as commonly understood by those skilled in the technical field of the present disclosure. The terms used herein is only for the purpose of describing the present disclosure, and is not intended to limit the present disclosure.

In the following description, "some embodiments" are referred to, which describe a subset of all possible embodiments, but it is understood that "some embodiments" may be the same subset or different subsets of all possible embodiments, and may be combined with each other without conflict.

It should be noted that, the terms "first\second\third" in the present disclosure are used for distinguishing similar objects and not necessarily for describing a specific sequence or sequential order. It is to be understood that the terms "first\ second \third" may be interchangeable under an appropriate circumstance, so that the embodiments of the present disclosure described herein are, for example, capable of being implemented in a sequence other than those illustrated or described herein.

The followings are explanations of the technical terms involved in the embodiments of the present disclosure and the corresponding relationship of some terms.

Dynamic Random Access Memory (DRAM)
Synchronous Dynamic Random Access Memory (SDRAM)
Low Power Double Data Rate (LPDDR) SDRAM
The 5th Generation LPDDR Specification (LP5 SPEC)
Row Hammer
Activation operation signal (Active)
Periodic refresh signal (Refresh)
Refresh management signal (refresh management)
Block signal (Block)
Mode Register (MR)

It can be understood that the Row Hammer attack means that a certain word line in the DRAM is activated repeatedly in a short time, which leads to data errors in one or more memory cells on a word line adjacent to the certain word line. At present, with the evolution of technology, the impact of the row hammer effect on DRAM is becoming increasingly serious.

Based on the above, embodiments of the present disclosure provide a signal control circuit including: a generating circuit, configured to accumulate execution times of an activation operation, and output a block signal in response to an accumulated value being greater than or equal to a first preset value; and a logic circuit, configured to receive an activation operation signal and the block signal, block outputting of the activation operation signal in response to receiving the block signal, and output the activation operation signal in response to not receiving the block signal. In this way, the signal control circuit can accumulate the execution times of the activation operation, and in response to the accumulated value being greater than or equal to the first preset value, a new activation operation signal is blocked by the block signal to avoid the recurrence of the activation operation, thereby further alleviating the problems caused by the Row Hammer attack.

Embodiments of the present disclosure will be described in detail below with reference to the accompanying drawings.

In an embodiment of the present disclosure, with reference to FIG. 1, a schematic structural diagram of a signal control circuit 10 according to an embodiment of the present disclosure is illustrated. As shown in FIG. 1, the signal control circuit 10 includes:

a generating circuit 11, configured to accumulate execution times of an activation operation, and output a block signal in response to an accumulated value being greater than or equal to a first preset value; and a logic circuit 12, configured to receive an activation operation signal and the block signal, block outputting of the activation operation signal in response to receiving the block signal, and output the activation operation signal in response to not receiving the block signal.

It should be noted that the signal control circuit 10 of the embodiment of the present disclosure can be applied to a variety of scenarios. Exemplarily, the signal control circuit 10 may be applied to a semiconductor memory to alleviate the effect caused by the Row Hammer attack. The signal control circuit 10 will be described in detail with a DRAM as an application scenario, but this does not constitute a related limitation.

Herein, the activation operation signal is used for instructing an activation operation to be performed on a corresponding word line in the DRAM.

It should be noted that, the DRAM may include multiple signal control circuits 10 respectively configured to process the activation operation for different memory areas. Specifically, the signal control circuit 10 includes a generating circuit 11 and a logic circuit 12. The generating circuit 11 can count the execution times of the activation operation in a certain memory area in the DRAM. In response to the accumulated value being greater than or equal to a first preset value, which indicates that the memory area may suffer from a Row Hammer attack, a block signal is outputted to the logic circuit 12. At this time, even if the logic circuit 12 receives a new activation operation signal, the activation operation signal will not be outputted, thereby avoiding the new activation operation being performed again in the memory area. Only after the refresh operation is performed on the memory area, can the normal activation operation be performed, thus avoiding data errors caused by the Row Hammer attack. In the present disclosure, the memory is divided into multiple memory areas and the number of times of activations in each memory area is monitored. In this way, compared with monitoring the number of times of activations of each word line, the occurrence of row hammer attacks can be prevented with less counters.

It should be noted that in some embodiments, the block signal may be an active high signal. Exemplarily, the logic circuit 12 may include a NOT gate and an AND gate. The NOT gate is configured to perform NOT operation on the block signal to obtain an inverted block signal; and the AND gate is configured to perform AND operation on the inverted block signal and the activation operation signal, and block or output the activation operation signal according to an operation result.

In some embodiments, the block signal may be an active low signal. Exemplarily, the logic circuit 12 may include an AND gate only. The AND gate is configured to perform AND operation on the block signal and the activation operation signal, and block or output the activation operation signal according to the operation result.

Figure 2:
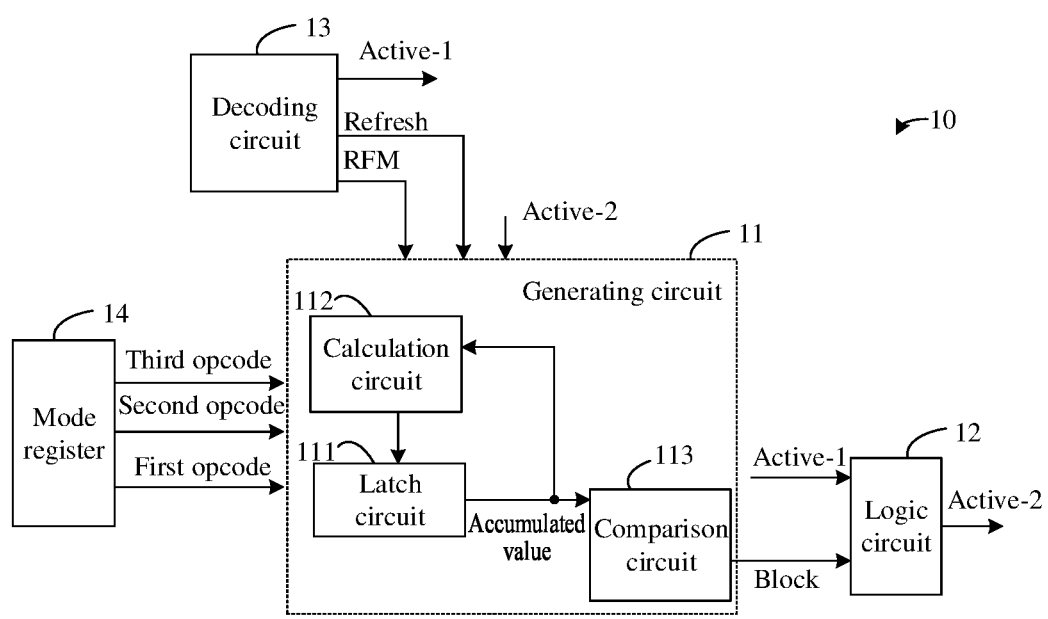
FIG. 2 illustrates a schematic structural diagram of another signal control circuit according to an embodiment of the present disclosure.

In some embodiments, as shown in FIG. 2, the generating circuit 11 is further configured to receive a periodic refresh signal Refresh, a refresh management signal RFM, or an activation operation signal Active-2 outputted by the logic circuit.

The generating circuit 11 is configured to increment the accumulated value by one in response to receiving the activation operation signal Active-2; decrement the accumulated value by a second preset value in response to receiving the periodic refresh signal Refresh; and decrement the accumulated value by a third preset value in response to receiving the refresh management signal RFM.

It should be noted that in DRAM, the traditional periodic refresh signal Refresh is used for periodically refreshing the memory cell to prevent data loss. In addition, LP5 Spec also provides refresh management signal RFM to implement supplementary refresh to alleviate the problems caused by the Row Hammer attack. In other words, the periodic refresh signal Refresh is a regular refresh command in the DRAM, and the refresh management signal RFM is an additional refresh command generated after it is detected that a Row Hammer may occur in the DRAM.

The present disclosure provides a specific control scheme for the refresh operation. The execution times of the activation operation are accumulated by using a rolling accumulated counter (i.e., the generating circuit 11). Specifically, each time an activation operation signal Active is received, the accumulated value is incremented by one; each time a periodic refresh signal Refresh is received, the accumulated value is decremented by a second preset value; and each time a refresh management signal RFM is received, the accumulated value is decremented by a third preset value. Thus, the implementation of the activation operation and the refresh operation can be evaluated through the accumulated value, and in a case where the refresh operation is insufficient, a refresh management signal RFM is generated to implement additional refresh processing, so as to reduce the risk of suffering from the row hammer attack.

In other words, the periodic refresh signal Refresh and the refresh management signal RFM are both used to instruct the DRAM to perform the refresh operation, which can alleviate the problems caused by the Row Hammer. Therefore, after the periodic refresh signal Refresh or the refresh management signal RFM is received, the refresh operation will be performed on the corresponding memory area to reduce the risk of suffering from the Row Hammer attack.

In addition, the refresh operation increases power consumption, and the refresh operation should not be performed too much as long as the refresh operation ensures that no Row Hammer occurs. Therefore, in most cases, the accumulated value of the generating circuit 11 is always positive.

It should also be noted that the specific values of the first preset value, the second preset value and the third preset value are not limited. In addition, in a signal control circuit, each of the first preset value, the second preset value or the third preset value can have multiple possible values, and the possible values can be selected by users according to actual usage requirements, to deal with different working scenarios.

It should be noted that the periodic refresh signal Refresh is implemented according to a tiing. If the accumulated value of the rolling accumulation counter is relatively high and the moment for implementation of the next periodic refresh signal Refresh is not reached, then another refresh management signal RFM can be generated to implement one supplementary refresh operation. Based on such processing logic, the second preset value can be defined to be equal to the third preset value. Furthermore, in order to bring better control effect, the second preset value may be defined to be less than the third preset value.

On this basis, as shown in FIG. 2, the signal control circuit 10 may further include a mode register 14 configured to receive a mode selection signal, and determine a first opcode, a second opcode and a third opcode according to the mode selection signal. The first opcode is used for indicating a multiple relationship between the first preset value and the second preset value, the second opcode is used for indicating a value of the second preset value, and the third opcode is used for indicating a multiple relationship between the third preset value and the second preset value; and The generating circuit is further configured to receive the first opcode, the second opcode and the third opcode; determine the second preset value according to the second opcode; determine the first preset value according to the first opcode and the second opcode, and determine the third preset value according to the third opcode and the second opcode.

In some embodiments, as shown in FIG. 2, the signal control circuit 10 may further include a decoding circuit 13 configured to receive a signal to be processed, decode the signal to be processed, and output the activation operation signal Active-1, the periodic refresh signal Refresh or the refresh management signal RFM accordingly.

Herein, the activation operation signal Active-1 is a signal received by an input terminal of the logic circuit 12, and the activation operation signal Active-2 is a signal outputted by an output terminal of the logic circuit 12.

It should be noted that the signal to be processed is generated by a front circuit and sent to the signal control circuit 10, and the signal to be processed is used for instructing the semiconductor memory to perform the corresponding operation.

In some embodiments, as shown in FIG. 2, the generating circuit 11 may include a calculation circuit 112 a latch circuit 111 and a comparison circuit 113.

The calculation circuit 112 is configured to perform arithmetic processing on the accumulated value to obtain a first arithmetic value, a second arithmetic value and a third arithmetic value.

The latch circuit 111 is configured to receive the activation operation signal Active-2, the periodic refresh signal Refresh or the refresh management signal RFM, and update the accumulated value based on the first arithmetic value corresponding to the activation operation signal Active-2, the second arithmetic value corresponding to the periodic refresh signal Refresh or the third arithmetic value corresponding to the refresh management signal RFM, and the latch circuit 111 is further configured to store an updated accumulated value.

The comparison circuit 113 is configured to compare the accumulated value with the first preset value, and output the block signal Block in response to the accumulated value being greater than or equal to the first preset value.

Herein, the input terminal of the calculation circuit 112 and the input terminal of the comparison circuit 113 are both connected to the output terminal of the latch circuit 111 and the output terminal of the calculation circuit 112 is connected to the input terminal of the latch circuit 111.

Figure 3A:
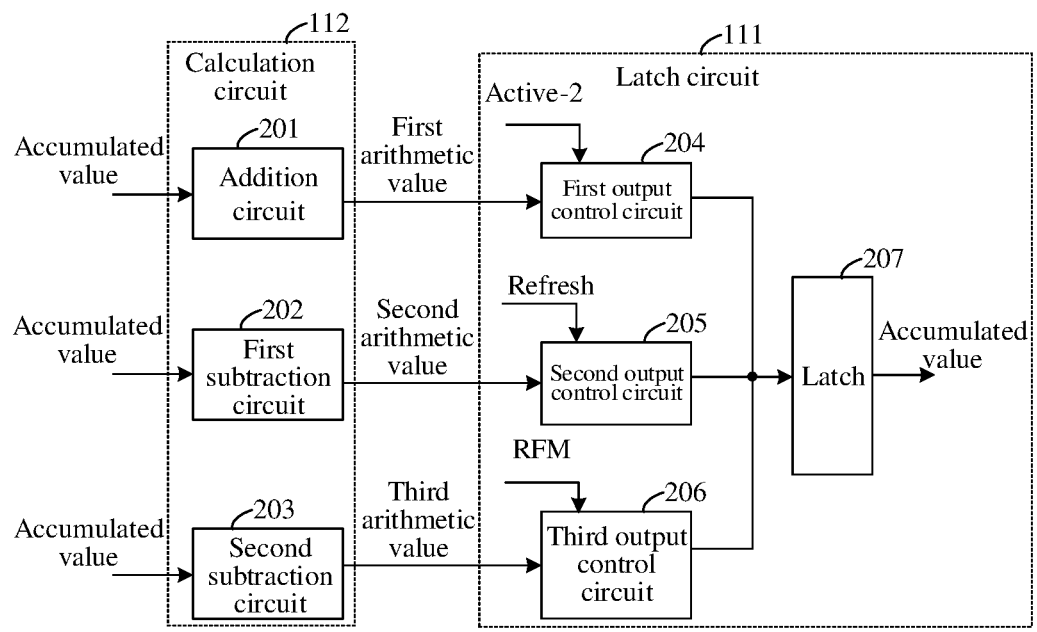
FIG. 3A illustrates a partial schematic structural diagram of a signal control circuit according to an embodiment of the present disclosure.

In some embodiments, with reference to FIG. 3A, a partial schematic structural diagram of a signal control circuit 10 according to an embodiment of the present disclosure is illustrated. As shown in FIG. 3A, the calculation circuit 112 may include an addition circuit 201 a first subtraction circuit 202 and a second subtraction circuit 203.

The addition circuit 201 is configured to increment the accumulated value by one and output the first arithmetic value.

The first subtraction circuit 202 is configured to perform subtraction processing between the accumulated value and the second preset value and output the second arithmetic value.

The second subtraction circuit 203 is configured to perform subtraction processing between the accumulated value and the third preset value and output the third arithmetic value.

Accordingly, in some embodiments, as shown in FIG. 3A, the latch circuit includes a first output control circuit 204, a second output control circuit 205, a third output control circuit 206 and a latch 207.

The first output control circuit 204 is configured to receive the activation operation signal Active-2 outputted by the logic circuit 12 and a first arithmetic value; and determine the first arithmetic value as the accumulated value in response to the activation operation signal Active-2 being received.

The second output control circuit 205 is configured to receive the periodic refresh signal Refresh and the second arithmetic value; and determine the second arithmetic value as the accumulated value in response to the periodic refresh signal Refresh being received.

The third output control circuit 206 is configured to receive the refresh management signal RFM and the third arithmetic value; and determine the third arithmetic value as the accumulated value in response to the refresh management signal RFM being received.

The output terminal of the latch 207 is configured to output the accumulated value.

That is to say, the calculation circuit 112 can simultaneously enable all the calculation circuits (the addition circuit 201, the first subtraction circuit 202, and the second subtraction circuit 203) to perform corresponding calculations on the accumulated values and simultaneously obtain multiple arithmetic values. The latch circuit 111 selects one of multiple arithmetic values according to a specific signal (activation operation signal Active-2, refresh management signal RFM or periodic refresh signal Refresh) received by the generating circuit 11 to generate a new accumulated value. In other words, only the latch circuit 111 needs to perform the corresponding operation according to the specific signal received by the generating circuit 11. In this way, the circuit complexity can be reduced and the number of signal terminals can be reduced.

In other embodiments, the generating circuit 11 includes a calculation circuit 112 a latch circuit 111 and a comparison circuit 113.

The calculation circuit 112 is configured to perform arithmetic processing on the accumulated value based on the activation operation signal Active-2, the periodic refresh signal Refresh or the refresh management signal RFM to obtain a target arithmetic value.

The latch circuit 111 is configured to update the accumulated value by using the target arithmetic value and store an updated accumulated value.

The comparison circuit 113 is configured to compare the accumulated value with the first preset value, and output the block signal in response to the accumulated value being greater than or equal to the first preset value.

Figure 3B:
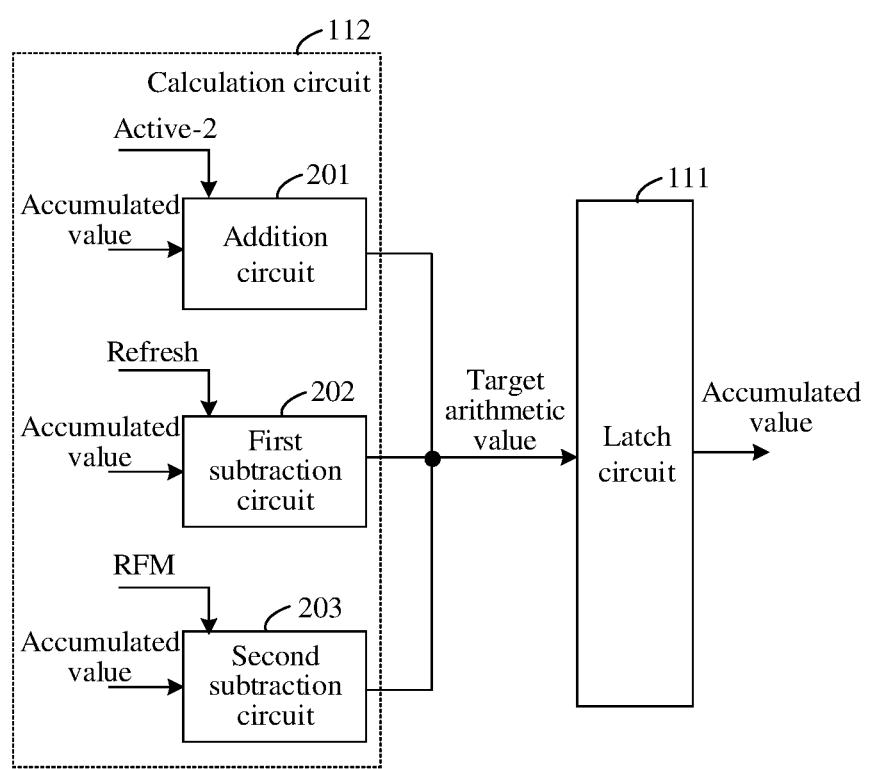
FIG. 3B illustrates a partial schematic structural diagram of another signal control circuit according to an embodiment of the present disclosure.

Accordingly, with reference to FIG. 3B, a partial schematic structural diagram of another signal control circuit 10 according to an embodiment of the present disclosure is illustrated. As shown in FIG. 3B, the calculation circuit 112 may include an addition circuit 201 a first subtraction circuit 202 and a second subtraction circuit 203.

The addition circuit 201 is configured to receive the activation operation signal Active-2 outputted by the logic circuit and the accumulated value; and increment the accumulated value by one and output the target arithmetic value in response to the activation operation signal Active-2 being received.

The first subtraction circuit 202 is configured to receive the periodic refresh signal Refresh and the accumulated value; and perform subtraction processing between the accumulated value and the second preset value and output the target arithmetic value in response to the periodic refresh signal Refresh being received.

The second subtraction circuit 203 is configured to receive the refresh management signal RFM and the accumulated value; and perform subtraction processing between the accumulated value and the third preset value and output the target arithmetic value in response to the refresh management signal RFM being received.

Accordingly, in some embodiments, as shown in FIG. 3B, the latch circuit 111 is configured to receive the target arithmetic value and update the accumulated value by using the target arithmetic value.

That is to say, the calculation circuit 112 may correspondingly control one of the addition circuit 201, the first subtraction circuit 202 or the second subtraction circuit 203 to perform a corresponding operation according to the specific signal (activation operation signal Active-2, refresh management signal RFM or periodic refresh signal Refresh) received by the generating circuit 11, so as to obtain a target arithmetic value by the corresponding operation. The latch circuit 111 updates the accumulated value by using the target arithmetic value. In this way, only the calculation circuit 112 needs to perform corresponding operations according to the specific signal received by the generating circuit 11, and only one calculation circuit performs calculation processing at a time, thus improving the working efficiency of the circuit.

In still other embodiments, as shown in FIG. 2, the generating circuit 11 includes a calculation circuit 112, a latch circuit 111 and a comparison circuit 113.

The calculation circuit 112 is configured to perform corresponding arithmetic processing on the accumulated value respectively based on the activation operation signal Active-2, the periodic refresh signal Refresh or the refresh management signal RFM, to obtain a first arithmetic value corresponding to the activation operation signal Active-2, a second arithmetic value corresponding to the periodic refresh signal Refresh or a third arithmetic value corresponding to the refresh management signal RFM.

The latch circuit 111 is configured to receive the activation operation signal Active-2, the periodic refresh signal Refresh or the refresh management signal RFM, update the accumulated value by using the first arithmetic value in response to receiving the activation operation signal Active-2, update the accumulated value by using the second arithmetic value in response to receiving the periodic refresh signal Refresh, and update the accumulated value by using the third arithmetic value in response to receiving the refresh management signal RFM. The latch circuit is further configured to store an updated accumulated value.

The comparison circuit 113 is configured to compare the accumulated value with the first preset value, and output the block signal Block in response to the accumulated value being greater than or equal to the first preset value.

Figure 3C:
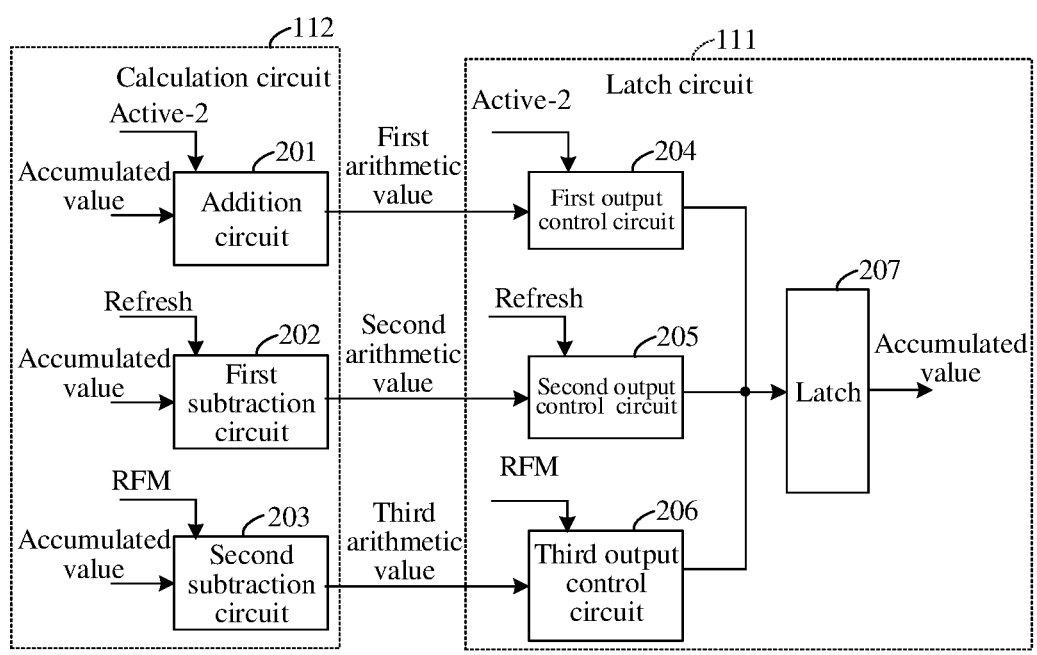
FIG. 3C illustrates a partial schematic structural diagram of yet another signal control circuit according to an embodiment of the present disclosure.

Accordingly, with reference to FIG. 3C, a partial schematic structural diagram of yet another signal control circuit 10 according to an embodiment of the present disclosure is illustrated. As shown in FIG. 3C, the calculation circuit 112 may include an addition circuit 201, a first subtraction circuit 202 and a second subtraction circuit 203.

The addition circuit 201 is configured to, in response to the calculation circuit 112 receiving the activation operation signal Active-2 outputted by the logic circuit 12, increment the accumulated value by one and output the first arithmetic value.

The first subtraction circuit 202 is configured to, in response to the calculation circuit 112 receiving the periodic refresh signal Refresh, perform subtraction processing between the accumulated value and the second preset value and output the second arithmetic value.

The second subtraction circuit 203 is configured to, in response to the calculation circuit 112 receiving the refresh management signal RFM, perform subtraction processing between the accumulated value and the third preset value and output the third arithmetic value.

In some embodiments, as shown in FIG. 3C, the latch circuit 111 may include a first output control circuit 204, a second output control circuit 205, a third output control circuit 206 and a latch 207.

The first output control circuit 204 is configured to determine the first arithmetic value as the accumulated value in response to the latch circuit 111 receiving the activation operation signal Active-2 outputted by the logic circuit 12. The first output control circuit 204 has a control terminal connected to an output terminal of the logic circuit 12, an input terminal connected to an output terminal of the addition circuit 201, and an output terminal connected to an input terminal of the latch 207.

A second output control circuit 205 is configured to determine the second arithmetic value as the accumulated value in response to the latch circuit 111 receiving the periodic refresh signal Refresh. The second output control circuit 205 has a control terminal configured to receive the periodic refresh signal Refresh, an input terminal connected to an output terminal of the first subtraction circuit 202, and an output terminal connected to the input terminal of the latch 207.

A third output control circuit 206 is configured to determine the third arithmetic value as the accumulated value in response to the latch circuit 111 receiving the refresh management signal RFM. The third output control circuit 206 has a control terminal configured to receive the refresh management signal RFM, an input terminal connected to an output terminal of the second subtraction circuit 203, and an output terminal connected to the input terminal of the latch 207.

An output terminal of the latch is configured to output the accumulated value.

It should be noted that the latch 207 can actively output a signal, i.e., the latch 207 continuously outputs the signal received at its input terminal to form the accumulated value; alternatively, the latch 207 may passively output a signal, i.e., after the control terminal of the latch 207 receives a request instruction from another circuit unit, the latch 207 outputs the signal received at the input terminal of the latch 207 to form the accumulated value.

It should be noted that, in the foregoing, according to the specific signal (the activation operation signal Active-2, the refresh management signal RFM or periodic refresh signal Refresh) received by the generating circuit 11, the calculation circuit 112 needs to enable the corresponding computing circuit (the addition circuit 201, the first subtraction circuit 202 or the second subtraction circuit 203) to calculate the accumulated value accordingly, to obtain the corresponding arithmetic value. In addition, the latch circuit 111 also determines the arithmetic value outputted by the calculation circuit 112 as a new accumulated value according to the specific signal received by the Generating circuit 11. In other words, both the calculation circuit 112 and the latch circuit 111 need to perform corresponding operations according to the specific signals received by the generating circuit 11, in this way, useless operation procedures can be avoided and power consumption of the circuit can be reduced.

It should be understood that the methods disclosed by the above three embodiments can also be further combined and adjusted according to the physical devices actually employed. For example, in the calculation circuit 112, certain calculation circuits (such as the first subtraction circuit 202 or the second subtraction circuit 203) are always enabled to calculate the accumulated value, or a corresponding calculation circuit (such as the addition circuit 201) is enabled to calculate the accumulated value in response to the generating circuit 11 receiving a certain signal (such as the activation operation signal Active-2), and so on. To sum up, the signal control circuit provided by the embodiments of the present disclosure can block a new activation operation signal when the activation operation is repeatedly performed in a certain memory area and the refresh operation is not performed in time, so as to avoid a new activation operation being performed, thereby avoiding the Row Hammer effect.

The embodiment provides a signal control circuit including: a generating circuit, configured to accumulate execution times of an activation operation, and output a block signal in response to an accumulated value being greater than or equal to a first preset value; and a logic circuit, configured to receive an activation operation signal and the block signal, block outputting of the activation operation signal in response to receiving the block signal, and output the activation operation signal in response to not receiving the block signal. In this way, the signal control circuit can accumulate the execution times of the activation operation, and in response to the accumulated value being greater than or equal to the first preset value, the new activation operation signal is blocked by the block signal, so that the recurrence of the activation operation is avoided before the refresh operation is completed, and the problem caused by the Row Hammer attack can be further alleviated.

Figure 4:
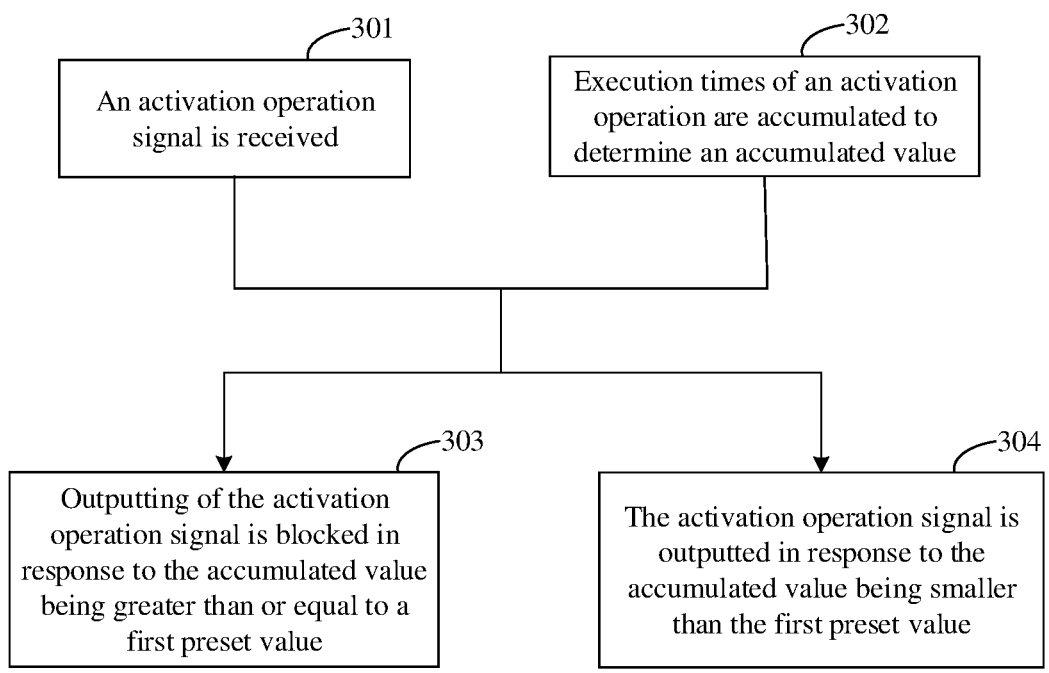
FIG. 4 illustrates a flowchart of a signal control method according to an the embodiment of the present disclosure.

In some embodiments of the present disclosure, with reference to FIG. 4, a flowchart of a signal control method according to an embodiment of the present disclosure is illustrated. As shown in FIG. 4, the method may include operations S301 to S304.

In operation S301, an activation operation signal is received.

It should be noted that the signal control method is applied to the aforementioned signal control circuit 10 to alleviate the problem caused by the Row Hammer attack in the DRAM.

Herein, the activation operation signal is used for instructing an activation operation to be performed on a corresponding word line.

In some embodiments, the operation that the activation operation signal is received may include:
 a signal to be processed is received; and
 the signal to be processed is decoded to obtain the activation operation signal, the periodic refresh signal or the refresh management signal accordingly.

In operation S302, execution times of an activation operation are accumulated to determine an accumulated value.

It should be noted that there is no sequence between operation S301 and operation S302. Specifically operation S302 is continuously implemented, and operation S301 occurs during implementation of the operation S302.

Herein, the accumulated value refers to actual execution times of the active operation in a memory area in the DRAM. That is to say, the accumulated value is determined by performing a continuous statistic on the actual execution times of the activation operation in the memory area. After the activation operation signal is received, the activation operation signal needs to be processed according to the accumulated value of real-time statistics.

In some embodiments, the operation that execution times of an activation operation are accumulated to determine the accumulated value, may include:
 a periodic refresh signal, a refresh management signal or an output activation operation signal is received; and
 the accumulated value is incremented by one in response to the outputted activation operation signal being received, the accumulated value is decremented by a second preset value in response to the periodic refresh signal being received, and the accumulated value is decremented by a third preset value in response to the refresh management signal being received.

In this way, after the activation operation signal is received, it is also necessary to determine the accumulated value to determine whether the activation operation is performed.

In operation S303, outputting of the activation operation signal is blocked in response to the accumulated value being greater than or equal to a first preset value.

In operation S304, the activation operation signal is outputted in response to the accumulated value being smaller than the first preset value.

It should be noted that, if the accumulated value is greater than or equal to the first preset value, e.g., the actual execution times of the activation operation in a certain memory area exceed a normal range, which indicates that the memory area may suffer from the Row Hammer attack, then the newly received activation operation signal will be blocked to avoid new activation operation in the memory area, and the data loss caused by Row Hammer attack will be prevented. On the contrary, if the accumulated value is less than the first preset value, the actual execution times of the activation operation in the memory area are still within the normal range, then after a new activation operation signal is received, the normal activation operation will be performed without affecting the normal function of the semiconductor memory.

Herein, each of the first preset value, the second preset value or the third preset value can have multiple possible values, and users can flexibly adjust the possible values according to actual usage requirements to deal with different working scenarios.

In some embodiments, the blocking of the activation operation signal may be implemented by the block signal. The operation that the outputting of the activation operation signal is blocked may include:

the accumulated value is compared with the first preset value, and the block signal is outputted in response to the accumulated value being greater than or equal to the first preset value;

logical operation is performed on the block signal and the activation operation signal, and the activation operation signal is blocked according to an operation result.

In some embodiments, the block signal may be an active high signal. Therefore, the operation that the logic operation is performed on the block signal and the activation operation signal to implement blocking of the activation operation signal may include:

NOT operation is performed on the block signal to obtain an inverted block signal; and AND operation is performed on the inverted block signal and the activation operation signal and the activation operation signal is blocked according to an operation result, or AND operation is performed on the inverted block signal and the activation operation signal and the activation operation signal is outputted according to the operation result.

In other embodiments, the block signal may be an active low signal. Therefore, the operation that the logic operation is performed on the block signal and the activation operation signal to implement blocking of the activation operation signal may include:

The AND operation is performed on the block signal and the activation operation signal, and the activation operation signal is blocked according to an operation result; or the AND operation is performed on the block signal and the activation operation signal, and the activation operation signal is outputted according to the operation result.

The embodiments of the disclosure provide a signal control method including the following operations. an activation operation signal is received; execution times of an activation operation are accumulated to determine an accumulated value; outputting of the activation operation signal is blocked in response to the accumulated value being greater than or equal to a first preset value; the activation operation signal is outputted in response to the accumulated value being smaller than the first preset value. In this way, the execution times of the activation operation are accumulated, and in response to the accumulated value being greater than or equal to the first preset value, the new activation operation signal is blocked by the block signal, so that the recurrence of the activation operation is avoided before the refresh operation is completed, and the problem caused by the Row Hammer attack can be further alleviated.

Figure 5:
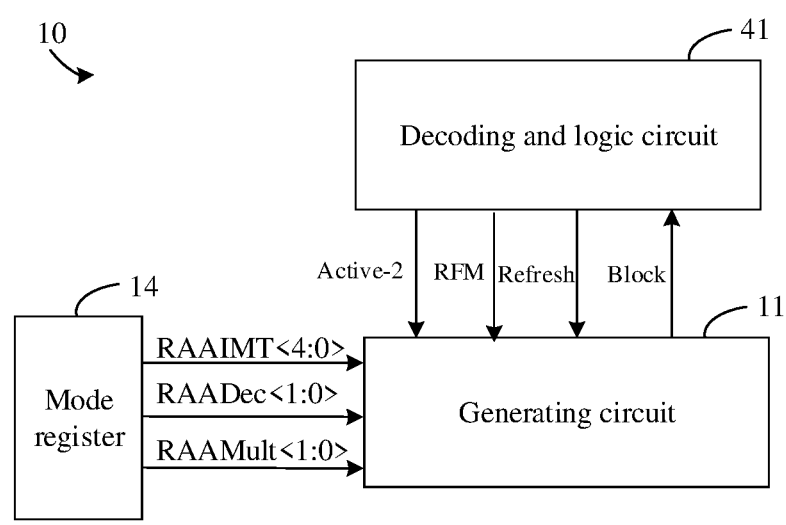
FIG. 5 illustrates a schematic structural diagram of still another signal control circuit according to an embodiment of the present disclosure.

In some embodiments of the present disclosure, with reference to FIG. 5, a schematic structural diagram of still another signal control circuit 10 according to an embodiment of the present disclosure is illustrated. As shown in FIG. 5 the signal control circuit 10 may include a generating circuit 11, a decoding and logic circuit 41 and a mode register 14.

Herein, the generating circuit 11 is configured to accumulate the execution times of the activation operation to obtain an accumulated value. Specifically, in response to the generating circuit 11 receiving the activation operation signal Active-2, the accumulated value is incremented by one; in response to the generating circuit 11 receiving the periodic refresh signal Refresh, the accumulated value is decremented by a second preset value; and in response to the generating circuit 11 receiving the refresh management signal RFM, the accumulated value is decremented by a third preset value. In addition, after the accumulated value is greater than or equal to the first preset value, the generating circuit 11 outputs a block signal Block to the decoding and logic circuit 41.

The decoding and logic circuit 41 is mainly configured to decode a signal to be processed. In addition, in a case where the signal to be processed is decoded to obtain an activation operation signal Active-1, if the block signal Block is not received, the activation operation signal Active-1 is outputted to instruct a normal activation operation to be performed in a certain memory area; and if block signal Block is received, the activation operation signal Active-1 is blocked to avoid the activation operation in a certain memory area again, thereby alleviating the problems caused by the Row Hammer attack. In other words, the decoding and logic circuit 41 may be considered as a combination of the decoding circuit 13 and the logic circuit 12 in FIG. 2.

The mode register 14 provides a first opcode RAAMult<1:0>, a second opcode RAAIMT<4:0> and a third opcode RAADec<1:0> to the generating circuit 11. Herein, the first opcode RAAMult<1:0> and the second opcode RAAIMT<4:0> are used for determining a first preset value, a second opcode RAAIMT<4:0> is used for determining a second preset value, and a third opcode RAADec<1:0> and a second opcode RAAIMT<4:0> are used for determining a third preset value.

Figure 6:
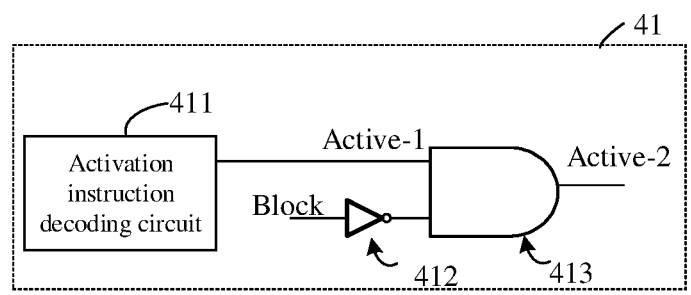
FIG. 6 illustrates a partial schematic structural diagram of a decoding and logic circuit according to an embodiment of the present disclosure.

With reference to FIG. 6, a partial schematic structural diagram of a decoding and logic circuit according to an embodiment of the present disclosure is illustrated. As shown in FIG. 6 the decoding and logic circuit 41 includes an activation instruction decoding circuit 411 a NOT gate 412 and an AND gate 413. Herein, the activation instruction decoding circuit 411 is configured to receive the signal to be processed and obtains the activation operation signal Active-1 in response to the decoding being successful. An input terminal of the NOT gate 412 is connected to the block signal Block, and two input terminals of the AND gate 413 are connected to the output terminal of the activation instruction decoding circuit 411 and the output terminal of the NOT gate 412 respectively. In this way, when the block signal Block is at the high level state, the output terminal of the AND gate 413 is always at the low level, thereby blocking the activation operation signal Active-1; and when the block signal Block is at the low level state, the output terminal of the AND gate 413 changes with the activation operation signal Active-1, thereby outputting the activation operation signal Active-1 to obtain the activation operation signal Active-2.

In addition, the decoding and logic circuit 41 further includes a periodic refresh instruction decoding circuit and a refresh management instruction decoding circuit. The periodic refresh instruction decoding circuit is configured to decode the signal to be processed and obtain the periodic refresh signal Refresh in response to the decoding being successful. The refresh management instruction decoding circuit is configured to decode the signal to be processed and obtain a refresh management signal RFM in response to the decoding being successful.

In some embodiments, the accumulated value includes a set of data Out<n>, Out<n−1> . . . Out<0>, denoted as Out<n:0>. Accordingly, the generating circuit 11 may include n+1 generating sub-circuits 42 respectively configured to determine Out<n>, Out<n−1> . . . Out<0>.

The following only takes Out<n> as an example to explain the determination process of the accumulated value, and the determination processes of other bits in the accumulated value can be understood by reference and will not be explained one by one.

Figure 7:
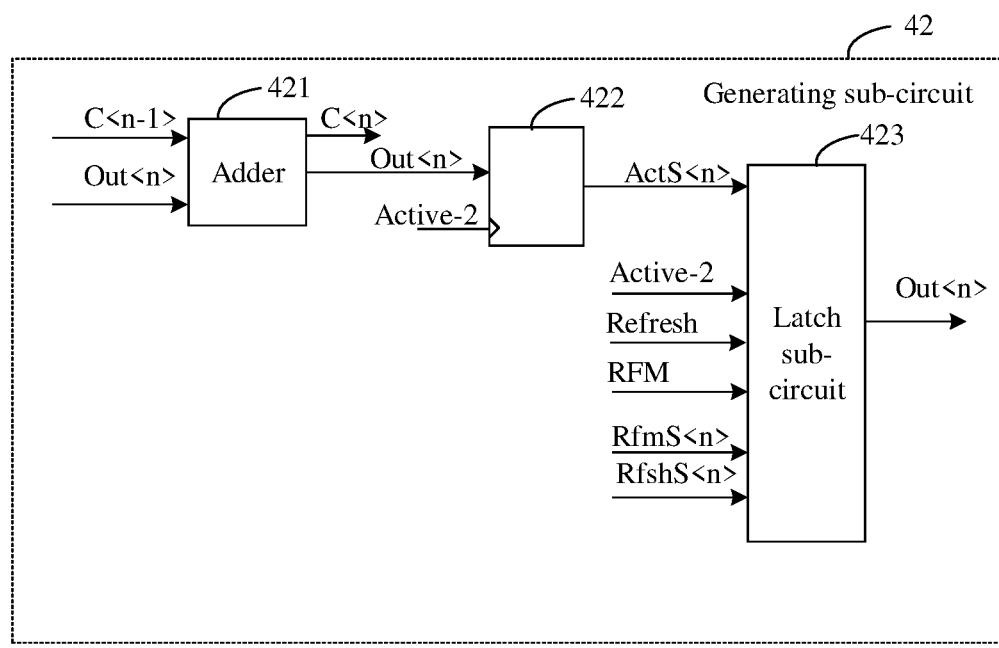
FIG. 7 illustrates a first partial schematic structural diagram of a generating circuit according to an embodiment of the present disclosure.

With reference to FIG. 7, a first partial schematic structural diagram of a generating circuit 11 according to an embodiment of the present disclosure is illustrated. Specifically, FIG. 7 shows a schematic structural diagram of a generating sub-circuit 42. As shown in FIG. 7, the generating sub-circuit 42 may include at least an adder 421 a flip-flop 422 and a latch sub-circuit 423.

As shown in FIG. 7, an input terminal of the adder 421 is configured to receive Out<n> and, a carry signal C<n−1> generated by an adder (not shown in the figure) in a generating sub-circuit corresponding to the Out<n−1>. An output terminal of the adder 421 is configured to output the carry signal C<n> and Out<n>. Herein, the adder 421 may be implemented by an XOR half adder, i.e., if data inputted into the input terminals of the adder 421 are the same, a low-level signal is outputted; and if the data inputted into the input terminals of the adder 421 are different, a high-level signal is outputted.

It should be noted that the input terminal of the adder 421 in the generating sub-circuit corresponding to Out<0> can be configured to receive Out<0> outputted by the latch sub-circuit and a count trigger signal, and the adder 421 can output Out<0> and C<0>, and the Out<0> outputted by the adder 421 subsequently enters the flip-flop 422 and the latch sub-circuit 423 successively. Herein, the count trigger signal may be an activation operation signal Active-2 or a high level signal.

An input terminal of the flip-flop 422 is configured to receive Out<n> outputted by the adder 421, a control terminal of the flip-flop 422 is configured to receive the activation operation signal Active-2, and an output terminal of the flip-flop 422 is configured to output ActS<n>. Herein, the ActS<n> refers to the (n+1)-th bit of data in the aforementioned first arithmetic value. In this way, the n+1 adders 421 and the n+1 flip-flops 422 together constitute the adder circuit 201 in FIG. 3C.

Figure 8:
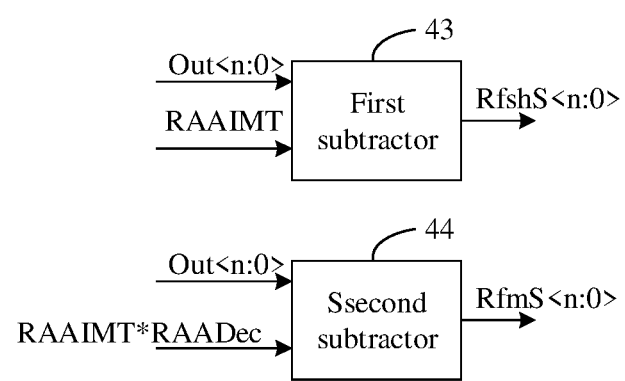
FIG. 8 illustrates a second partial schematic structural diagram of a generating circuit according to an embodiment of the present disclosure.

Furthermore, (n+1)-th bit of data in the second arithmetic value may be represented by RfshS<n>, and (n+1)-th bit of data in the third arithmetic value may be represented by RfmS<n>. In addition, with reference to FIG. 8, a second partial schematic structural diagram of a generating circuit 11 according to an embodiment of the present disclosure is illustrated. As shown in FIG. 8, the generating circuit 11 may further include a first subtractor 43 (which can be equivalent to the first subtraction circuit 202 in FIG. 3C) and a second subtractor 44 (which can be equivalent to the second subtraction circuit 203 in FIG. 3C). Inputs of the first subtractor 43 are the Out<n:0> and a second preset value (represented by RAAIMT), and RfshS<n:0> is obtained by performing the subtraction operation between the Out<n:0> and the second preset value. Inputs of the second subtractor 44 are the Out<n:0> and a third preset value (represented by RAAIMT*RAADec), and Rfms<n:0> is obtained by performing the subtraction operation between the Out<n:0> and the third preset value. In addition, the (n+1)-th bit of data of RfshS<n: 0> is the aforementioned RfshS<n>, and the (n+1)-th bit of data of RfmS<N:0> is the aforementioned RfmS<n>.

The latch sub-circuit 423 is configured to: in response to the activation operation signal Active-2 being received, output the ActS<n> as Out<n>; in response to the periodic refresh signal Refresh being received, output RfshS<n> as Out<n>; and in response to the refresh management signal RFM being received, output RfmS<n> as Out<n>.

Figure 9:
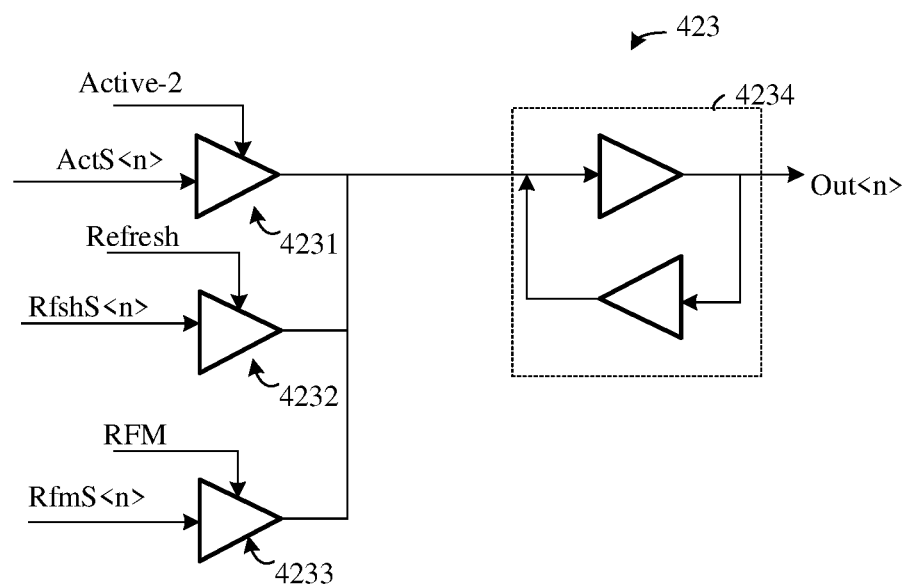
FIG. 9 illustrates a third partial schematic structural diagram of a generating circuit according to an embodiment of the present disclosure.

With reference to FIG. 9, a third partial schematic structural diagram of a generating circuit 11 according to an embodiment of the present disclosure is illustrated. Specifically, FIG. 9 is specific schematic structural diagram of the latch sub-circuit 423. As shown in FIG. 9, the latch sub-circuit 423 includes a first output control sub-circuit 4231, a second output control sub-circuit 4232, a third output control sub-circuit 4233 and a latch sub-unit 4234.

The first output control sub-circuit 4231 has an input terminal configured to receive ActS<n>, and a control terminal configured to receive the activation operation signal Active-2. The first output control sub-circuit 4231 is configured to output ActS<n> to the latch sub-unit 4234 in response to the activation operation signal Active-2 being received. The second output control sub-circuit 4232 has an input terminal configured to receive the RfshS<n>, and a control terminal configured to receive the periodic refresh signal Refresh. The second output control sub-circuit 4232 is configured to output the RfshS<n> to the latch sub-unit 4234 in response to the periodic refresh signal Refresh being received. The third output control sub-circuit 4233 has an input terminal configured to receive the RfmS<n>, and a control terminal configured to receive the refresh management signal RFM. The third output control sub-circuit 4233 is configured to output the RfmS<n> to the latch sub-unit 4234 in response to the refresh management signal RFM being received. The latch sub-unit 4234 mainly serves a signal holding function and is configured to output the received signal as Out<n>.

Herein, n+1 first output control sub-circuits 4231 together constitute the first output control circuit 204 in FIG. 3C, n+1 second output control sub-circuits 4232 together constitute the second output control circuit 205 in FIG. 3C, n+1 third output control sub-circuits 4233 together constitute the third output control circuit 206 in FIG. 3C, and n+1 latch sub-units 4234 together constitute the latch 207 in FIG. 3C.

Exemplarily, the first output control sub-circuit 4231, the second output control sub-circuit 4232, and the third output control sub-circuit 4233 have a same structure, and each of them is constituted by one tri-state buffer. The latch sub-unit 4234 includes two buffers connected with each other in a head-to-tail manner.

In this way, the Out<n> to the Out<0> can be obtained respectively by the n+1 latch sub-circuits 423 in the generating circuit 11, thereby obtaining the accumulated value Out<n:0>.

Figure 10:
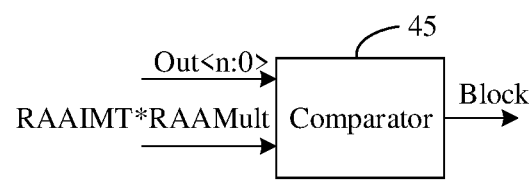
FIG. 10 illustrates a fourth partial schematic structural diagram of a generating circuit according to an embodiment of the present disclosure.

With reference to FIG. 10, a fourth partial schematic structural diagram of a generating circuit according to an embodiment of the present disclosure is illustrated. As shown in FIG. 10, the generating circuit 11 further includes a comparator 45 (which can be equivalent to the comparison circuit 113 in FIG. 2) configured to receive the accumulated value Out<n: 0> and the first preset value (represented by RAAIMT*RAAMult), and output the block signal Block in response to the accumulated value Out<n:0> being greater than or equal to the first preset value.

To sum up, FIG. 5 and FIG. 6 show block diagrams illustrating the operation principle of the entire signal control circuit 10. Firstly, the generating circuit 11 is configured to increment the accumulated value by one in response to the activation operation signal Active-2 being received; decrement the accumulated value by a second preset value (provided by the mode register 14) in response to the periodic refresh signal Refresh being received; or decrement the accumulated value by a third preset value (provided by the mode register 14) in response to the refresh management signal RFM being received. During operation of the signal control circuit 10, if the accumulated value of the generating circuit 11 reaches the first preset value (provided by the mode register 14), the block signal is outputted to block a new activation operation signal. FIG. 7 to FIG. 10 are schematic structural diagram of the generating circuit 11 implemented by an adder, a subtractor, a multi-bit latch and the like. Specifically, the adder is configured to count the cumulative number of times that the Active-2 operation signal is received, so as to determine the first arithmetic value. The first subtractor 43 decrements the current accumulated value by the second preset value in real time to determine the second arithmetic value, and the second subtractor 44 decrements the current accumulated value by the third preset value in real time to determine the third arithmetic value. The latch sub-circuit 423 is configured to latch the first arithmetic value corresponding to the activation operation signal Active-2, the second arithmetic value corresponding to the periodic refresh signal Refresh or the third arithmetic value corresponding to the refresh management signal RFM accordingly according to the received activation operation signal Active-2, the periodic refresh signal Refresh or the refresh management signal RFM. The comparator 45 compares the current accumulated value with the first preset value in real time to generate a block signal Block.

Embodiments of the present disclosure provide a signal control circuit, the specific implementations of the preceding embodiments are described in detail through this embodiment, it can be seen that the signal control circuit can accumulate the execution times of the activation operation, and in response to the accumulated value being greater than or equal to the first preset value, the new activation operation signal is blocked by the block signal, so that the recurrence of the activation operation is avoided before the refresh operation is completed, and the problem caused by the Row Hammer attack can be further alleviated.

Figure 11:
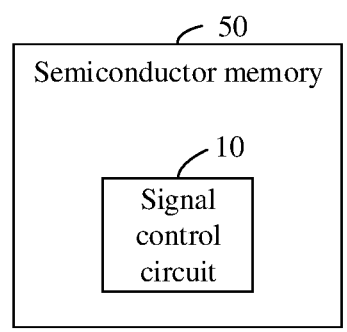
FIG. 11 illustrates a schematic structural diagram of a semiconductor memory according to an embodiment of the present disclosure.

In yet another embodiment of the present disclosure, with reference to FIG. 11, a schematic structural diagram of a semiconductor memory 50 according to an embodiment of the present disclosure is illustrated. As shown in FIG. 11, the semiconductor memory 50 may include the signal control circuit 10 of any of the foregoing embodiments to alleviate the problems caused by the Row Hammer attack.

The above are only preferred embodiments of the present disclosure and are not intended to limit the scope of protection of the present disclosure. It is to be noted that, in this disclosure, the terms "includes", "including" or any other variation thereof, are intended to cover a non-exclusive inclusion, such that a process, method, article, or device that includes a list of elements includes not only those elements but also other elements not expressly listed, or also includes elements inherent to such process, method, article, or device. Without more limitations, an element is defined by the statement "including a . . . " that does not rule out there are additional identical elements in a process, method, article, or apparatus that includes the element. The above-described embodiments of the present disclosure are for the purpose of description only and do not represent the advantages or disadvantages of the embodiments. The methods disclosed in the method embodiments provided in this disclosure can be arbitrarily combined without conflict to obtain new method embodiments. The features disclosed in the product embodiments provided in this disclosure can be arbitrarily combined without conflict to obtain new product embodiments. The features disclosed in the method or apparatus embodiments provided in this disclosure can be arbitrarily combined without conflict to obtain new method embodiments or apparatus embodiments. The above is only the specific embodiments of the disclosure, but the scope of protection of the disclosure is not limited to this. Any person skilled in the technical field who can easily think of change or replacement within the technical scope of the disclosure shall be covered in the scope of protection of the disclosure. Therefore, the protection scope of the disclosure shall be subject to the protection scope of the claims.

The embodiments of the disclosure provide a signal control circuit, a signal control method and a semiconductor memory. The signal control circuit includes: a generating circuit, configured to accumulate execution times of an activation operation, and output a block signal in response to an accumulated value being greater than or equal to a first preset value; and a logic circuit, configured to receive an activation operation signal and the block signal, block outputting of the activation operation signal in response to receiving the block signal, and output the activation operation signal in response to not receiving the block signal. In this way, the signal control circuit can accumulate the execution times of the activation operation, and in response to the accumulated value being greater than or equal to the first preset value, a new activation operation signal is blocked by the block signal to avoid the recurrence of the activation operation, thereby alleviating the problems caused by the Row Hammer attack.

What is claimed is:

1. A signal control circuit, comprising:
a generating circuit, configured to accumulate execution times of an activation operation, and output a block signal in response to an accumulated value being greater than or equal to a first preset value; and
a logic circuit, configured to receive an activation operation signal and the block signal, block outputting of the activation operation signal in response to receiving the block signal, and output the activation operation signal in response to not receiving the block signal;

wherein the logic circuit comprises a NOT gate and an AND gate, wherein the NOT gate is configured to perform NOT operation on the block signal to obtain an inverted block signal; and the AND gate is configured to perform AND operation on the inverted block signal and the activation operation signal, and block or output the activation operation signal according to an operation result.

2. The signal control circuit of claim 1, wherein the generating circuit is further configured to:

receive a periodic refresh signal, a refresh management signal, or the activation operation signal outputted by the logic circuit; and increment the accumulated value by one in response to receiving the activation operation signal; decrement the accumulated value by a second preset value in response to receiving the periodic refresh signal; and decrement the accumulated value by a third preset value in response to receiving the refresh management signal.

3. The signal control circuit of claim 2, wherein the generating circuit comprises a calculation circuit, a latch circuit, and a comparison circuit, wherein the calculation circuit is configured to perform arithmetic processing on the accumulated value to obtain a first arithmetic value, a second arithmetic value and a third arithmetic value;

the latch circuit is configured to receive the activation operation signal, the periodic refresh signal or the refresh management signal, and update the accumulated value based on the first arithmetic value corresponding to the activation operation signal, the second arithmetic value corresponding to the periodic refresh signal or the third arithmetic value corresponding to the refresh management signal, and the latch circuit is further configured to store an updated accumulated value; and the comparison circuit is configured to compare the accumulated value with the first preset value, and output the block signal in response to the accumulated value being greater than or equal to the first preset value.

4. The signal control circuit of claim 2, wherein the generating circuit comprises a calculation circuit, a latch circuit, and a comparison circuit, wherein the calculation circuit is configured to perform arithmetic processing on the accumulated value based on the activation operation signal, the periodic refresh signal or the refresh management signal to obtain a target arithmetic value;

the latch circuit is configured to update the accumulated value by using the target arithmetic value and store an updated accumulated value; and the comparison circuit is configured to compare the accumulated value with the first preset value, and output the block signal in response to the accumulated value being greater than or equal to the first preset value.

5. The signal control circuit of claim 2, wherein the generating circuit comprises a calculation circuit, a latch circuit, and a comparison circuit, the calculation circuit is configured to perform corresponding arithmetic processing on the accumulated value respectively based on the activation operation signal, the periodic refresh signal or the refresh management signal, to obtain a first arithmetic value corresponding to the activation operation signal, a second arithmetic value corresponding to the periodic refresh signal or a third arithmetic value corresponding to the refresh management signal;

the latch circuit is configured to receive the activation operation signal, the periodic refresh signal or the refresh management signal, update the accumulated value by using the first arithmetic value in response to receiving the activation operation signal, update the accumulated value by using the second arithmetic value in response to receiving the periodic refresh signal, and update the accumulated value by using the third arithmetic value in response to receiving the refresh management signal, and the latch circuit is further configured to store an updated accumulated value; and the comparison circuit is configured to compare the accumulated value with the first preset value, and output the block signal in response to the accumulated value being greater than or equal to the first preset value.

6. The signal control circuit of claim 5, wherein the calculation circuit comprises an addition circuit, a first subtraction circuit, and a second subtraction circuit, the addition circuit is configured to, in response to the calculation circuit receiving the activation operation signal outputted by the logic circuit, increment the accumulated value by one and output the first arithmetic value;

the first subtraction circuit is configured to, in response to the calculation circuit receiving the periodic refresh signal, perform subtraction processing between the accumulated value and the second preset value and output the second arithmetic value; and the second subtraction circuit is configured to, in response to the calculation circuit receiving the refresh management signal, perform subtraction processing between the accumulated value and the third preset value and output the third arithmetic value.

7. The signal control circuit of claim 6, wherein the latch circuit comprises a first output control circuit, a second output control circuit, a third output control circuit and a latch, wherein the first output control circuit is configured to determine the first arithmetic value as the accumulated value in response to the latch circuit receiving the activation operation signal outputted by the logic circuit, wherein the first output control circuit has a control terminal connected to an output terminal of the logic circuit, an input terminal connected to an output terminal of the addition circuit, and an output terminal connected to an input terminal of the latch;

the second output control circuit is configured to determine the second arithmetic value as the accumulated value in response to the latch circuit receiving the periodic refresh signal, wherein the second output control circuit has a control terminal configured to receive the periodic refresh signal, an input terminal connected to an output terminal of the first subtraction circuit, and an output terminal connected to the input terminal of the latch;

the third output control circuit is configured to determine the third arithmetic value as the accumulated value in response to the latch circuit receiving the refresh management signal, wherein the third output control circuit has a control terminal configured to receive the refresh management signal, an input terminal connected to an output terminal of the second subtraction circuit, and an output terminal connected to the input terminal of the latch; and an output terminal of the latch is configured to output the accumulated value.

8. The signal control circuit of claim 2, further comprising:

a decoding circuit, configured to receive a signal to be processed, decode the signal to be processed, and output the activation operation signal, the periodic refresh signal or the refresh management signal accordingly.

9. A semiconductor memory, comprising the signal control circuit of claim 1.

10. A signal control circuit, comprising:

a generating circuit, configured to accumulate execution times of an activation operation, and output a block signal in response to an accumulated value being greater than or equal to a first preset value; and a logic circuit, configured to receive an activation operation signal and the block signal, block outputting of the activation operation signal in response to receiving the block signal, and output the activation operation signal in response to not receiving the block signal;

wherein the generating circuit is further configured to:

receive a periodic refresh signal, a refresh management signal, or the activation operation signal outputted by the logic circuit; and increment the accumulated value by one in response to receiving the activation operation signal; decrement the accumulated value by a second preset value in response to receiving the periodic refresh signal; and decrement the accumulated value by a third preset value in response to receiving the refresh management signal;

wherein the first preset value is n times larger than the second preset value, n being greater than 1; and the third preset value is m larger than the second preset value, m being greater than or equal to 1.

11. The signal control circuit of claim 10, further comprising:

a mode register, configured to receive a mode selection signal, and determine a first opcode, a second opcode and a third opcode according to the mode selection signal, wherein the first opcode is used for indicating a multiple relationship between the first preset value and the second preset value, the second opcode is used for indicating a value of the second preset value, and the third opcode is used for indicating a multiple relationship between the third preset value and the second preset value, wherein the generating circuit is further configured to receive the first opcode, the second opcode and the third opcode, determine the second preset value according to the second opcode, determine the first preset value according to the first opcode and the second opcode, and determine the third preset value according to the third opcode and the second opcode.

12. A semiconductor memory, comprising the signal control circuit of claim 10.

13. A signal control method, comprising:

receiving an activation operation signal; and accumulating execution times of an activation operation to determine an accumulated value, blocking outputting of the activation operation signal in response to the accumulated value being greater than or equal to a first preset value, and outputting the activation operation signal in response to the accumulated value being smaller than the first preset value;

wherein blocking the outputting of the activation operation signal in response to the accumulated value being greater than or equal to the first preset value comprises:

comparing the accumulated value with the first preset value, and outputting the block signal in response to the accumulated value being greater than or equal to the first preset value; and performing logical operation on the block signal and the activation operation signal, and blocking the activation operation signal according to an operation result.

14. The signal control method of claim 13, wherein accumulating the execution times of the activation operation to determine the accumulated value comprises:

receiving a periodic refresh signal, a refresh management signal, or an outputted activation operation signal; and incrementing the accumulated value by one in response to receiving the outputted activation operation signal, decrementing the accumulated value by a second preset value in response to receiving the periodic refresh signal, and decrementing the accumulated value by a third preset value in response to receiving the refresh management signal.

15. The signal control method of claim 14, wherein receiving the activation operation signal comprises:

receiving a signal to be processed; and decoding the signal to be processed to obtain the activation operation signal, the periodic refresh signal or the refresh management signal accordingly.

16. The signal control method of claim 13, wherein performing the logical operation on the block signal and the activation operation signal to implement blocking of the activation operation signal comprises:

performing NOT operation on the block signal to obtain an inverted block signal; and performing AND operation on the inverted block signal and the activation operation signal and blocking the activation operation signal according to an operation result, or performing AND operation on the inverted block signal and the activation operation signal and outputting the activation operation signal according to the operation result.

* * * * *